(12) United States Patent  
Xu et al.

(10) Patent No.: US 10,383,243 B2  
(45) Date of Patent: Aug. 13, 2019

(54) FIXING MEMBER, DEVICE FOR MOUNTING CIRCUIT BOARDS, AND DISPLAY APPARATUS

(71) Applicant: BOE TECHNOLOGY GROUP CO., LTD., Beijing (CN)

(72) Inventors: Jian Xu, Beijing (CN); Pan Li, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/569,807

(22) PCT Filed: May 31, 2017

(86) PCT No.: PCT/CN2017/086541  
§ 371 (c)(1),  
(2) Date: Oct. 27, 2017

(87) PCT Pub. No.: WO2018/001027  
PCT Pub. Date: Jan. 4, 2018

(65) Prior Publication Data  
US 2018/0228046 A1    Aug. 9, 2018

(30) Foreign Application Priority Data  
Jun. 28, 2016  (CN) .................. 2016 2 0666554 U

(51) Int. Cl.  
*H05K 7/14* (2006.01)  
*H01R 12/70* (2011.01)  
(Continued)

(52) U.S. Cl.  
CPC ....... *H05K 7/1405* (2013.01); *G02F 1/13452* (2013.01); *G02F 1/133308* (2013.01);  
(Continued)

(58) Field of Classification Search  
CPC .............. H05K 7/1405; H05K 13/0069; G02F 1/1333; G02F 2001/133322; H01R 12/7076; B25B 5/02  
See application file for complete search history.

(56) References Cited

U.S. PATENT DOCUMENTS 9,645,425 B2 *   5/2017  Hsiao ................ G02F 1/133308  
2008/0296821 A1 * 12/2008  Carnevali ................. B25B 5/02  
                                                                 269/164  
(Continued)

FOREIGN PATENT DOCUMENTS

CN          101968580 A      2/2011  
CN          202349878 U      7/2012  
(Continued)

OTHER PUBLICATIONS

Search Report for International Patent Application No. PCT/CN2017/086541 dated Aug. 24, 2017.

*Primary Examiner* — Hoa C Nguyen  
*Assistant Examiner* — Keith DePew  
(74) *Attorney, Agent, or Firm* — Calfee, Halter & Griswold LLP

(57) ABSTRACT

A fixing member, a device for mounting a circuit board, and a display apparatus so as to conveniently and firmly fix a PCB on the back plate of the back-light module are disclosed. The fixing member includes a supporting plate, a first clamping part fixedly arranged on an upper surface of the supporting plate, and a second clamping part facing the first clamping part. The first clamping part and the supporting plate form a first U-shape clamping groove. The second clamping part and the supporting plate form a second U-shape clamping groove. An opening of the first U-shape clamping groove faces an opening of the second U-shape  
(Continued)

clamping groove. The fixing member is used for fixing the circuit board on the back plate.

15 Claims, 3 Drawing Sheets

(51) Int. Cl.
  *G02F 1/1333* (2006.01)
  *G02F 1/1345* (2006.01)
(52) U.S. Cl.
  CPC .............. *H01R 12/7076* (2013.01); *G02F 2001/133314* (2013.01)

(56) References Cited

U.S. PATENT DOCUMENTS

| | | | |
|---|---|---|---|
| 2012/0032380 A1* | 2/2012 | Riachentsev | B25B 5/06 269/8 |
| 2014/0063399 A1* | 3/2014 | Kuo | G02F 1/133608 349/58 |
| 2016/0129560 A1* | 5/2016 | Yang | B25B 5/006 269/20 |
| 2017/0006726 A1* | 1/2017 | Li | H05K 7/1404 |

FOREIGN PATENT DOCUMENTS

| | | |
|---|---|---|
| CN | 102830545 A | 12/2012 |
| CN | 205720981 U | 11/2016 |
| KR | 101565935 B1 | 11/2015 |

* cited by examiner

US 10,383,243 B2

FIXING MEMBER, DEVICE FOR MOUNTING CIRCUIT BOARDS, AND DISPLAY APPARATUS

RELATED APPLICATION

The present application is the U.S. national phase entry of PCT/CN2017/086541, with an international filing date of May 31, 2017, which claims the benefit of Chinese Patent Application No. 201620666554.X, filed on Jun. 28, 2016, the entire disclosures of which are incorporated herein by reference.

TECHNICAL FIELD

The present disclosure relates to the field of display technologies, in particular to a fixing member, a device for mounting a circuit board and a display apparatus.

BACKGROUND

At present, a display apparatus usually includes a display panel, a back-light module arranged on one side of the display panel, and a Printed Circuit Board (PCB) for driving and controlling the display panel, wherein the PCB is connected to the display panel via a Flexible Printed Circuit Board (hereinafter referred to as FPC or COF, etc.).

In the above-mentioned display apparatus, the PCB is generally fixed on a back plate of the back-light module. Commonly used ways of fixing include: using screw locks, specifically, the PCB is fixed on the back plate using screw locks; using adhesive tapes, specifically, the PCB is stuck to the back plate using adhesive tapes.

However, if screw locks are used, the screws needs to be tightened, so the mounting is inconvenient; when adhesive tapes are used, the adhesive tapes tend to lose their stickiness in high-temperature or high-humidity environments, and the PCB will detach from the back plate, so the fastness is not good.

SUMMARY

The present disclosure aims at providing a fixing member, a device for mounting a circuit board and a display apparatus so as to conveniently and firmly fix the PCB on the back plate of the back-light module.

According to a first aspect of the present disclosure, a fixing member is provided, which comprises: a supporting plate, a first clamping part fixedly arranged on an upper surface of the supporting plate, and a second clamping part facing said first clamping part; wherein said first clamping part and said supporting plate form a first U-shape clamping groove, and said second clamping part and said supporting plate form a second U-shape clamping groove, and an opening of said first U-shape clamping groove faces an opening of said second U-shape clamping groove.

When fixing a circuit board using the fixing member provided in the first aspect of the present disclosure, both ends of the circuit board can be clamped in the first U-shape clamping groove and the second U-shape clamping groove, respectively, thereby fixing the circuit board. This can make mounting more convenient compared to the way of using screw locks, so the convenience of mounting is improved. In addition, compared to fixing the circuit board by adhesive tapes, fixing the circuit board by clamping is less affected by the environment of high temperature or high humidity, so it can firmly fix the circuit board on the back plate of the back-light module.

According to a second aspect of the present disclosure, a device for mounting a circuit board is provided, which comprises a back plate and a fixing member as described in the first aspect of the present disclosure, the fixing member being mounted on the back plate.

According to a third aspect of the present disclosure, a display apparatus is provided, which comprises a circuit board and a device for mounting a circuit board as described in the second aspect of the present disclosure, the device for mounting a circuit board being configure to fix said circuit board.

BRIEF DESCRIPTION OF THE DRAWINGS

In order to describe the embodiments of the present disclosure more clearly, the figures that are to be used in descriptions of the embodiments will be introduced briefly below. The figures below are merely some of the embodiments of the present disclosure.

REFERENCE NUMERALS

1—back plate;
2; circuit board;
3—fixing member;
4—display panel;
5—FPC;
102—back hole;
103—locating hole;
104—mounting hole;
302—second clamping part;
303—first clamping part;
305—supporting leg;
306—locating pin;
3011—guiding groove;
3012—supporting plate;
3021—second horizontal plate;
3022—second vertical plate;
3023—connecting part;
3024—anti-escaping elastic piece;
3031—first horizontal plate;
3032—first vertical plate;
3043—convex;
3051—third horizontal plate;
3052—third vertical plate.

DETAILED DESCRIPTION

Technical solutions in the embodiments of the present disclosure will be described clearly and completely below with reference to the figures. Apparently, the described embodiments are merely some instead of all of the embodiments of the present disclosure.

It shall be noted that the "upper surface of the supporting plate" as mentioned in the embodiments below refers to a side of the supporting plate facing away from the back plate when mounting the fixing member to the back plate; the "lower surface of the supporting plate" refers to a side of the supporting plate near the back plate when mounting the fixing member to the back plate, and the "lower surface of the supporting plate" and the "upper surface of the supporting plate" are opposite; the "upper surface of the third horizontal plate" refers to a side of the third horizontal plate near the supporting plate and it faces the lower surface of the supporting plate.

In addition, the word "horizontal" used in "first horizontal plate", "second horizontal plate" and "third horizontal plate" in the embodiments below refers to a direction or plane parallel to the main surface of the back plate when the fixing member is mounted on the back plate; in contrast, the word "vertical" used in "first vertical plate", "second vertical plate" and "third vertical plate" in the embodiments below refers to a direction or plane vertical to the main surface of the back plate when the fixing member is mounted on the back plate.

First Embodiment

Figure 1:
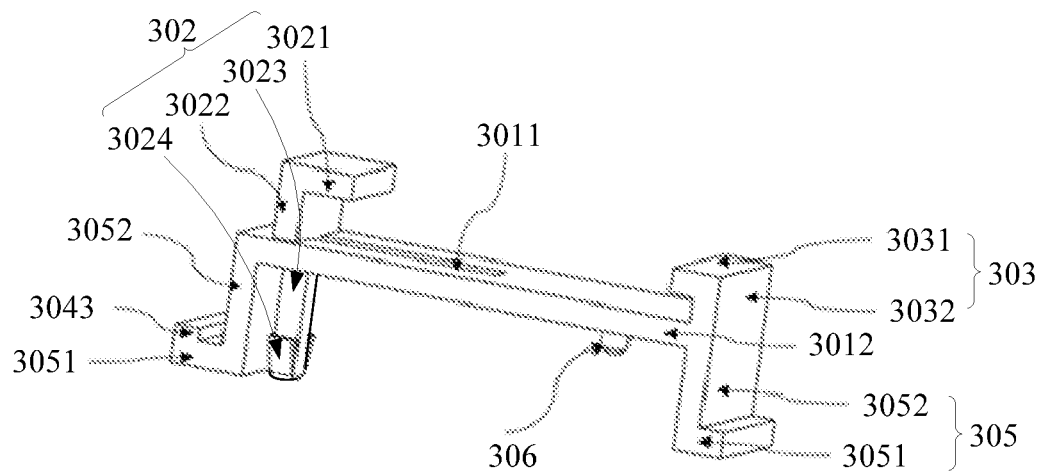
FIG. 1 is a structural diagram of a fixing member in a first embodiment of the present disclosure.
Figure 2:
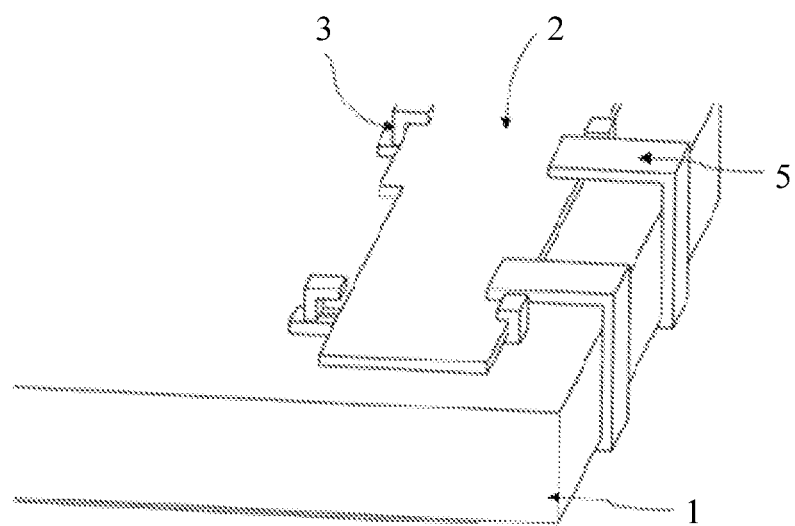
FIG. 2 is a first structural diagram of a device for mounting a circuit board in a second embodiment of the present disclosure.
Figure 3:
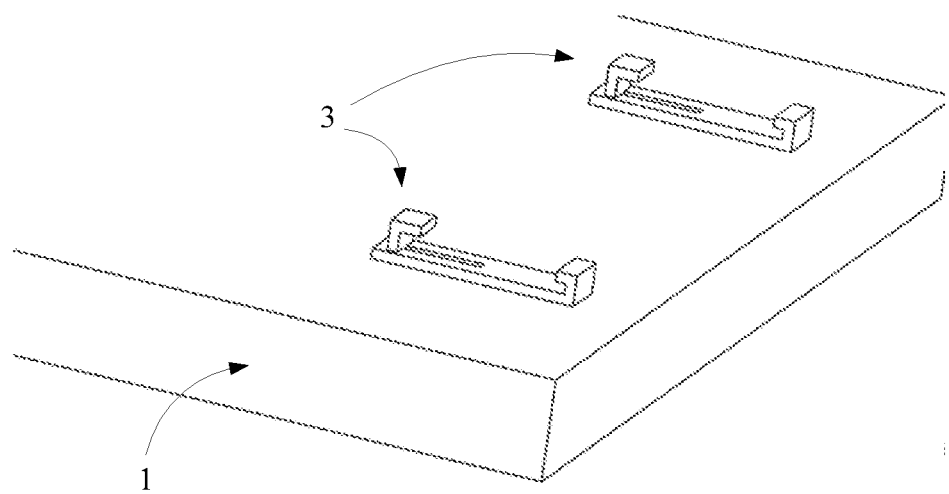
FIG. 3 is a second structural diagram of a device for mounting a circuit board in a second embodiment of the present disclosure.

As shown in FIG. 1, this embodiment provides a fixing member 3 which comprises: a supporting plate 3012, a first clamping part 303 fixedly arranged on an upper surface of the supporting plate 3012, and a second clamping part 302 facing said first clamping part 303; wherein said first clamping part 303 and said supporting plate 3012 form a first U-shape clamping groove, and said second clamping part 302 and said supporting plate 3012 form a second U-shape clamping groove, and an opening of said first U-shape clamping groove faces an opening of said second U-shape clamping groove.

When fixing a circuit board using said fixing member 3, both ends of the circuit board can be clamped in the first U-shape clamping groove and the second U-shape clamping groove, respectively, thereby fixing the circuit board. Mounting of the circuit board can be realized by directly clamping the two ends of the circuit board within the fixing member 3, so compared to the way of using screw locks, the convenience of mounting is improved. In addition, compared to fixing the circuit board by adhesive tapes, fixing the circuit board by clamping is less affected by the environment of high temperature or high humidity, so it can firmly fix the circuit board on the back plate of the back-light module.

The first clamping part 303 and the second clamping part 302 that can realize fixing of the circuit board may have various forms of structures. As shown in FIG. 1, in an embodiment, the first clamping part 303 includes a first horizontal plate 3031 and a first vertical plate 3032 that is fixed on an upper surface of a supporting plate 3012; the second clamping part 302 includes a second horizontal plate 3021 and a second vertical plate 3022 that is fixed on the supporting plate 3012. Optionally, the first horizontal plate 3031 and the first vertical plate 3032 can form a first L-shape plate, and the second horizontal plate 3021 and the second vertical plate 3022 can form a second L-shape plate, and a height of the first vertical plate 3032 above the upper surface of the supporting plate 3012 may be equal to a height of the second vertical plate 3022 above the upper surface of the supporting plate 3012.

Specifically, as shown in FIG. 1, the first horizontal plate 3031 and the first vertical plate 3032 forming the first clamping part 303 are both rectangular plates. In the azimuth shown in FIG. 1, the first vertical plate 3032 has its bottom fixed on a first end of the supporting plate 3012, and the first vertical plate 3032 has its top fixedly connected to a right end of the first horizontal plate 3031; likewise, the second horizontal plate 3021 and the second vertical plate 3022 forming the second clamping part 302 can both be rectangular plates, the second vertical plate 3022 has its top fixedly connected to a left end of the second horizontal plate 3021. A left end of the first horizontal plate 3031 faces a right end of the second horizontal plate 3021. Along a direction vertical to the upper surface of the supporting plate 3012, the first vertical plate 3031 and the second vertical plate 3021 may have the same height when using the upper surface of the supporting plate 3012 as a reference plane.

Because of the existence of the first horizontal plate 3031 in the first clamping part 303, the circuit board can be clamped in the first U-shape groove formed by the first clamping part 303 and the supporting plate 3012 so as to prevent the circuit board from escaping along a direction vertical to the upper surface of the supporting plate 3012; likewise, because of the existence of the second horizontal plate 3021 in the second clamping part 302, the circuit board can be clamped in the second U-shape groove formed by the second clamping part 302 and the supporting plate 3012 so as to prevent the circuit board from escaping along a direction vertical to the upper surface of the supporting plate 3012. Besides, if the first vertical plate 3031 and the second vertical plate 3021 have the same height, the circuit board clamped in the first U-shape groove and the second U-shape groove will not waver, thus increasing fastness of fixing of the circuit board on the fixing member 3.

Still referring to FIG. 1, the fixing member 3 may further include a supporting leg 305 fixedly arranged on a lower surface of the supporting plate 3012 so as to facilitate mounting of the fixing member 3 to a carrier like the back plate. Specifically, the back plate is provided with holes matching the supporting legs 305, and during mounting, the supporting legs are mounted into the corresponding holes so as to mount the fixing member 3 to the back plate. Optionally, there may be a number of supporting legs 305, which are fixedly arranged on both ends of the supporting plate 3012. Each supporting leg 305 may be of a structure comprising a third vertical plate 3052 fixedly connected to one end of the supporting plate 3012 and a third horizontal plate 3051 fixedly connected to an end of the third vertical plate 3052 far away from the supporting plate 3012, the third vertical plate 3052 and the third horizontal plate 3051 may form an L-shape structure. The third horizontal plate 3051 can prevent the supporting legs 305 from escaping from the corresponding holes on the back plate. Optionally, there may be two supporting legs 305 which are fixedly arranged on both ends of the supporting plate 3012, respectively, and the supporting plate 3012 and the two supporting legs 305 form a structure having a shape like "⊓".

Referring to FIG. 1, on the basis of the solution of the supporting leg 305 including the third vertical plate 3052 and the third horizontal plate 3051, in order to increase stability of the fixing member 3 on the back plate, a convex 3043 may be arranged on at least one supporting leg 305, said convex 3043 being located on an upper surface of an end of the third horizontal plate 3051 far away from the third vertical plate 3052. When the supporting legs 305 have been mounted into the corresponding holes of the back plate, the convex 3043 can be against an inner side of the back plate around the holes (i.e. a side of the back plate near the display panel) so as to increase friction between the supporting legs 305 and the back plate to avoid escaping of the supporting legs 305 from corresponding holes of the back plate. It shall be noted that the "upper surface" of the third horizontal plate 3051 refers to a side of the third horizontal plate 3051 near the supporting plate 3012.

As shown in FIG. 1, the supporting plate 3012 and the supporting legs 305 in this embodiment can be integrated, so that the design and manufacturing thereof is simple; besides, since the supporting plate 3012 and the supporting legs 305 do not require any connecting part, mounting of the fixing member 3 becomes convenient.

Referring to FIG. 1, when fixing the fixing member 3 on the back plate, in order to facilitate locating of the fixing member 3, a locating pin 306 may be provided on the lower surface of the supporting plate 3012, by which the fixing member 3 can be quickly located. Moreover, a locating hole matching the locating pin 306 may be provided on the back plate, so that the locating pin 306 can be used to further fix said fixing member 3, thereby increasing stability of the fixing member 3.

Optionally, the supporting plate 3012 and the first clamping part 303 can be integrated. Such a design can be easily manufactured, and since the supporting plate 3012 and the first clamping part 303 do not require any connecting part, mounting of the fixing member 3 becomes convenient.

As shown in FIG. 1, the supporting plate 3012 may further include a guiding groove 3011, and the second clamping part 302 may be mounted in said guiding groove 3011 so that a distance between the second clamping part 302 and the first clamping part 303 becomes adjustable. The supporting plate 3012 can optionally be a strip plate, and the end of said supporting plate 3012 fixedly connected to the first clamping part 303 is called a first end of the supporting plate, while the other end opposite to the first end is called a second end of the supporting plate, the guiding groove 3011 is defined as extending from the second end of the supporting plate 3012 to the first end of the supporting plate 3012. When circuit boards of different widths need to be fixed, according to widths of the circuit boards to be fixed, the second clamping part 302 is moved toward or away from the first clamping part 303 along the guiding groove 3011 so as to adjust the distance between the second clamping part 302 and the first clamping part 303, as a result, the fixing member can be used for fixing circuit boards of different widths.

On the basis of the above solution that the distance between the first clamping part 303 and the second clamping part 302 is adjustable, the second clamping part 302 may further include a connecting part 3023 arranged on an end of the second vertical plate 3022 far away from the second horizontal plate 3021, and the connecting part 3023 is inserted into the guiding groove 3011 so as to realize mounting of the second clamping part 302 on the supporting plate 3012.

Referring again to FIG. 1, in order to avoid escaping of the connecting part 3023 of the second clamping part 302 from the guiding groove 3011 during moving, an anti-escaping elastic piece 3024 may be arranged on an end of the connecting part 3023 far away from the second vertical plate 3022. The anti-escaping elastic piece 3024 may be an umbrella shaped hook facing the lower surface of the supporting plate 3012, and an end of the connecting part 3023 far away from the second vertical plate 3022 passes through the guiding groove 3011. When the connecting part 3023 passes through the guiding groove 3011, hook heads of the umbrella shaped hook contact a side face of the connecting part 3023, so that the connecting part 3023 passes through the guiding groove 3011. Afterwards, the hook heads of the umbrella shaped hook restores, so that a distance between the hook heads of the umbrella shaped hook is greater than a width of a guiding part of the guiding groove 3011, thereby preventing the connecting part 3023 from escaping from the guiding part of the guiding groove 3011.

In the case where the fixing member 3 comprises the supporting leg 305 provided with the convex, said supporting leg 305 provided with the convex can be a supporting leg near the guiding groove 3011 (said supporting leg 305 being located on the second end of the supporting plate). Using such a design, when pushing the second clamping part 302, a certain friction can be generated between said convex 3043 and the back plate, thus avoiding escaping of the supporting leg 305 near the guiding groove 3011 from the corresponding hole of the back plate under the force of the pushing.

The above-mentioned supporting plate 3012, first clamping part 303, second clamping part 302 and supporting leg 305 are all elastic structures, and the second clamping part 302 and the guiding groove 3011 are under an interference fit. Since the fixing member 3 consisting of the supporting plate 3012, the two supporting legs 305, the first clamping part 303 and the second clamping part 302 is an elastic structure, the fixing member 3 has strong elasticity, which can facilitate mounting of the fixing member 3 to the back plate. For example, in the process of fixing the fixing member 3 to the back plate, since the supporting legs 305 are elastic structures, they can be inserted, in their contraction states, into corresponding holes on the back plate, and by means of the expansion forces of the supporting legs 305 in the holes, the two supporting legs 305 are respectively fixed on the back plate, thereby realizing mounting of the fixing member 3. In addition, in the process of using the fixing member 3 for fixing the circuit board, since the second clamping part 302 and the guiding groove 3011 are under an interference fit, the second clamping part 302 is clamped in a desired position in the guiding groove 3011. Moreover, since the connecting part 3023 of the second clamping part 302 and the supporting plate 3012 are both elastic structures, by means of the expansion force of the connecting part 3023 in the guiding groove 3011 of the supporting plate 3012, the connecting part 3023 can be clamped in a desired position in the guiding groove 3011, thereby ensuring stability of mounting of the circuit board on the fixing member 3.

The fixing member 3 as mentioned above can be an elastic structure consisting of the supporting plate 3012, the first clamping part 303, the second clamping part 302 and the supporting legs 305, and said fixing member 3 having the elastic structure can be formed of resin, plastic or rubber, etc.

Second Embodiment

This embodiment provides a device for mounting a circuit board, which comprises: a back plate 1 and the fixing member 3 mentioned in the above first embodiment, said fixing member 3 being mounted on said back plate 1.

When fixing a circuit board 2 using the fixing member 3 in said device, the circuit board 2 is placed on the upper surface of the supporting plate 3012 and between the first U-shape clamping groove and the second U-shape clamping groove, so that the two ends of the circuit board 2 are clamped in the first U-shape clamping groove and the second U-shape clamping groove, respectively to fix the circuit board 2.

It can be seen that the device for mounting a circuit board in this embodiment realizes mounting of the circuit board by means of clamping, so the mounting is convenient and firm.

Figure 4:
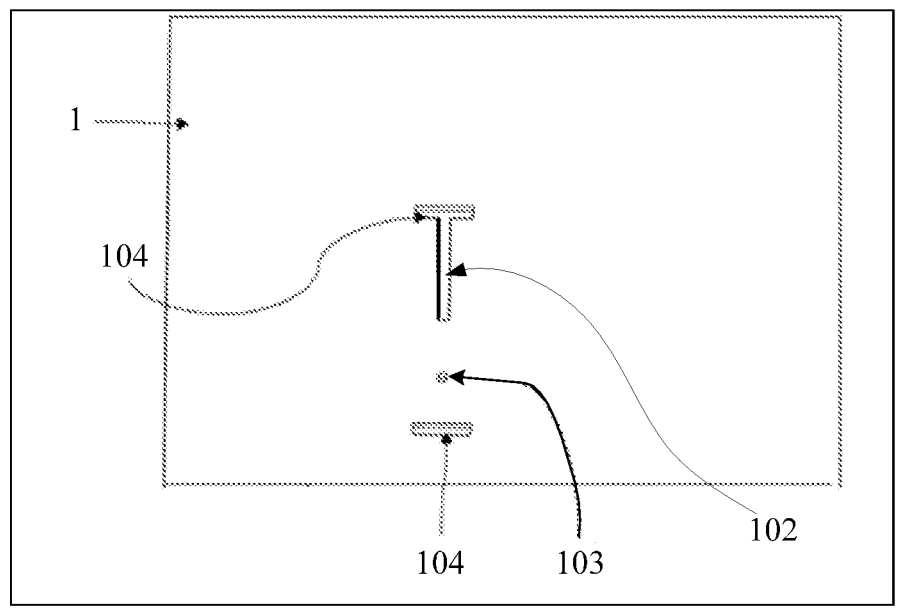
FIG. 4 is a structural diagram of a back side of a back plate in the device for mounting a circuit board in the second embodiment of the present disclosure.

Referring to FIGS. 1 and 4, in order to facilitate fixing of the fixing member 3 on the back plate 1, the fixing member 3 comprises supporting legs 305 and supporting plate 3012, the supporting legs 305 being fixedly arranged on the lower surface of the supporting plate 3012. Correspondingly, mounting holes 104 can be arranged on the back plate 1, and the supporting legs 305 can be clamped into the mounting holes 104. Optionally, the fixing member 3 may include two supporting legs 305 which are fixedly arranged on both ends of the supporting plate 3012, respectively, and the supporting plate 3012 and the two supporting legs 305 form a structure having a shape like "冂". Mounting holes 104 are correspondingly arranged on the back plate 1, and the two supporting legs 305 are clamped into their corresponding mounting holes 104.

As shown in FIGS. 1 and 4, if a locating pin 306 is provided on the lower surface of the supporting plate of the fixing member 3, a locating hole 103 matching the locating pin 306 may be provided on the back plate 1, and the locating pin 306 can be inserted into said locating hole 103 so as to enhance stability of the fixing member 3 on the back plate 1.

The supporting plate 3012 of the fixing member 3 may have a guiding groove 3011, and the second clamping part 302 can be mounted in said guiding groove 3011, so that the distance between the second clamping part 302 and the first clamping part 303 is adjustable. Based on such a structure, as shown in FIG. 4, a back hole 102 may be arranged on an area of the back plate 1 facing the guiding groove 3011, and an end of the second clamping part 302 passes through said back hole 102 to facilitate sliding of the second clamping part 302. By means of such a design, when circuit boards of different widths need to be fixed, according to widths of the circuit boards to be fixed, the second clamping part 302 is moved toward or away from the first clamping part 303 along the guiding groove 3011 so as to adjust the distance between the second clamping part 302 and the first clamping part 303, as a result, the device for fixing a circuit board in this embodiment can be used for mounting circuit boards of different widths.

Further, in order to simplify the step of making holes on the back plate 1, the back hole 102 can be made to be connected to the mounting hole 104 nearby, so that the back hole 102 and the nearby mounting hole 104 can be made integrally; specifically, the back hole 102 is connected to the nearby mounting hole 104 to form a T-shape hole, so that a T-shape hole can be directly made on the back plate 1, which can meet the needs for both the back hole 102 and the mounting hole 104.

Third Embodiment

Figure 5:
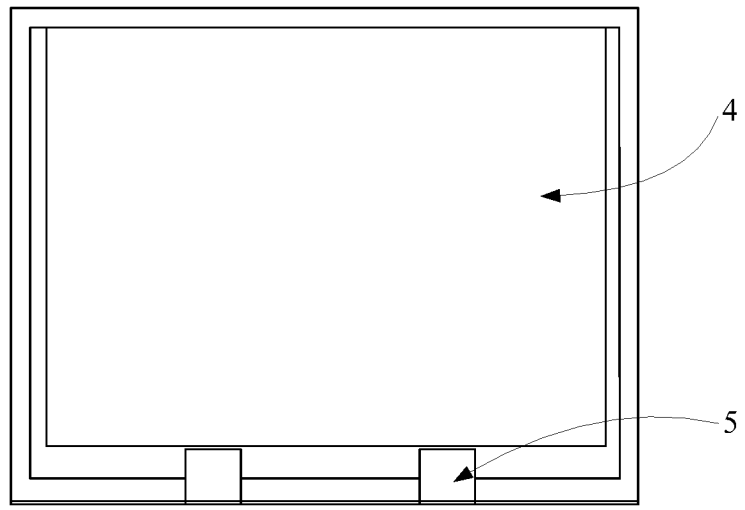
FIG. 5 is a structural diagram of a front side of a display apparatus in a third embodiment of the present disclosure.
Figure 6:
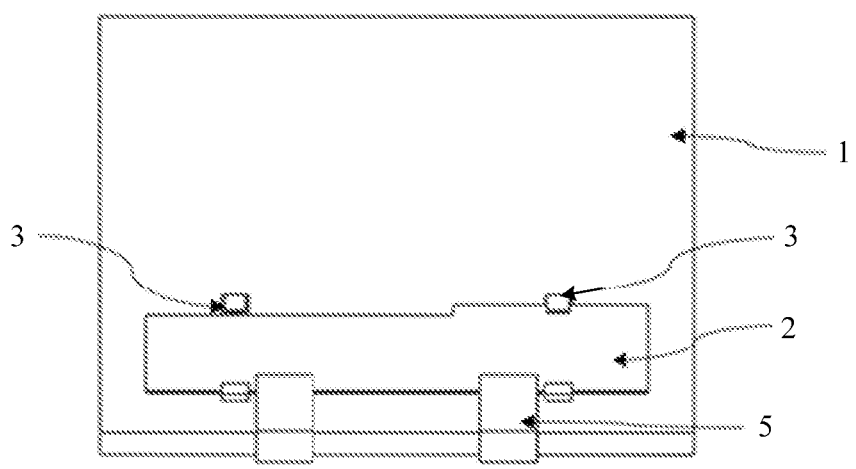
FIG. 6 is a structural diagram of a back side of a display apparatus in a third embodiment of the present disclosure.

As shown in FIGS. 5 and 6, this embodiment provides a display apparatus, which comprises: a circuit board 2 and a device for mounting a circuit board as mentioned in the above embodiment, the circuit board 2 being mounted in said device. It shall be noted that the back plate 1 in said device refers to the back plate 1 of the back-light module.

The display apparatus in this embodiment has the circuit board 2 fixed by clamping, so said display apparatus can conveniently and firmly fix the circuit board on the back plate of the back-light module. Further, the display apparatus of the present embodiment can also fix circuit boards 2 having different widths.

The display apparatus in this embodiment can be any product or component having a display function, such as a liquid crystal panel, electronic paper, a mobile phone, a tablet PC, a TV, a laptop computer, a digital photo frame, a navigator, etc.

The above described are merely specific embodiments of the present disclosure, while they do not intend to limit the protection scope of the present disclosure. Any variation or substitution that is easily conceivable by those skilled in the art within the technical scope disclosed by the present disclosure shall fall into the protection scope of the present disclosure. The protection scope of the present disclosure is defined by the appended claims.

The invention claimed is:

1. A fixing member comprising: a supporting plate, a first clamping part fixedly arranged on an upper surface of the supporting plate, and a second clamping part facing said first clamping part; wherein
    said first clamping part and said supporting plate form a first U-shape clamping groove, and said second clamping part and said supporting plate form a second U-shape clamping groove, and an opening of said first U-shape clamping groove faces an opening of said second U-shape clamping groove;
    the fixing member further comprising:
        supporting legs, fixedly arranged on a lower surface of the supporting plate and arranged on both ends of the supporting plate, and
        a locating pin, arranged on the lower surface of the supporting plate and in an area of the supporting plate that is between the supporting legs.

2. The fixing member according to claim 1, wherein the first clamping part comprises a first horizontal plate and a first vertical plate fixedly connected to the first horizontal plate, said first vertical plate being fixed on the upper surface of the supporting plate;
    the second clamping part comprises a second horizontal plate and a second vertical plate fixedly connected to the second horizontal plate, said second vertical plate being fixed on the supporting plate.

3. The fixing member according to claim 1, wherein each of the supporting legs comprises a third vertical plate fixedly connected to one end of the supporting plate and a third horizontal plate fixedly connected to an end of the third vertical plate far away from the supporting plate.

4. The fixing member according to claim 1, wherein at least one supporting leg further comprises a convex located on an upper surface of an end of the third horizontal plate of the supporting leg far away from the third vertical plate.

5. The fixing member according to claim 4, wherein the supporting plate and the supporting legs are integrated.

6. The fixing member according to claim 1, wherein the supporting plate and the first clamping part are integrated.

7. The fixing member according to claim 1, wherein the supporting plate has a guiding groove, and the second clamping part is mounted in said guiding groove, and a distance between the second clamping part and the first clamping part is adjustable.

8. The fixing member according to claim 7, wherein the second clamping part has a connecting part passing through the guiding groove, and an anti-escaping elastic piece is provided on an end of the connecting part far away from the supporting plate.

9. The fixing member according to claim 8, wherein the supporting plate, the first clamping part, the second clamping part and the supporting leg are all elastic, and the second clamping part and the guiding groove are under an interference fit.

10. A device for mounting a circuit board, comprising a back plate and the fixing member according to claim 1, said fixing member being mounted on the back plate.

11. The device according to claim 10, wherein
the back plate is provided with mounting holes, and the supporting legs are clamped into said mounting holes; and
a locating hole is arranged on an area of the back plate facing the locating pin, said locating hole matching the locating pin.

12. The device according to claim 10, wherein the supporting plate of the fixing member has a guiding groove, the second clamping part of the fixing member is mounted in said guiding groove, and a distance between the second clamping part and the first clamping part of the fixing member is adjustable; and
wherein a back hole is arranged on an area of the back plate facing the guiding groove, and an end of the second clamping part passes through said back hole.

13. A display apparatus comprising a circuit board and the device for mounting a circuit board according to claim 10 for fixing said circuit board.

14. The display apparatus according to claim 13, wherein
the back plate is provided with mounting holes, and the supporting legs are clamped into said mounting holes; and
a locating hole is arranged on an area of the back plate facing the locating pin, said locating hole matching the locating pin.

15. The display apparatus according to claim 13, wherein the supporting plate of the fixing member has a guiding groove, the second clamping part of the fixing member is mounted in said guiding groove, and a distance between the second clamping part and the first clamping part of the fixing member is adjustable; and
wherein a back hole is arranged on an area of the back plate facing the guiding groove, and an end of the second clamping part passes through said back hole.

* * * * *